(12) United States Patent
Hsieh et al.

(10) Patent No.: US 8,105,002 B2
(45) Date of Patent: Jan. 31, 2012

(54) WELD ASSEMBLY

(75) Inventors: Kun-Chih Hsieh, Taipei Hsien (TW); Jian-Qiang Zhao, Shenzhen (CN); Fan-Peng Zeng, Shenzhen (CN); Lin-He Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 302 days.

(21) Appl. No.: 12/539,570

(22) Filed: Aug. 11, 2009

(65) Prior Publication Data

US 2010/0226731 A1    Sep. 9, 2010

(30) Foreign Application Priority Data

Mar. 7, 2009  (CN) ............... 2009 2 0301134 U

(51) Int. Cl.
 *F16B 37/06* (2006.01)

(52) U.S. Cl. ................................ 411/171; 228/168
(58) Field of Classification Search ............. 411/82, 411/82.1, 171, 187, 188, 435; 219/85.1–85.22; 228/168, 174
See application file for complete search history.

(56) References Cited

U.S. PATENT DOCUMENTS

| | | | | | |
|---|---|---|---|---|---|
| 957,931 | A | * | 5/1910 | Bond | 411/81 |
| 2,426,653 | A | * | 9/1947 | Whelan et al. | 411/82.1 |
| 2,595,830 | A | * | 5/1952 | Demboske | 411/171 |
| 3,282,015 | A | * | 11/1966 | Rohe et al. | 52/704 |
| 3,621,557 | A | * | 11/1971 | Cushman | 29/460 |
| 4,800,643 | A | * | 1/1989 | Higgins | 29/458 |
| 5,823,729 | A | * | 10/1998 | Nagayama | 411/429 |
| 6,241,441 | B1 | * | 6/2001 | Erb | 411/120 |

* cited by examiner

*Primary Examiner* — Flemming Saether
(74) *Attorney, Agent, or Firm* — Altis Law Group, Inc.

(57) ABSTRACT

A weld nut includes a main body and a flange. The flange is extended outwardly from the main body and surrounding the main body, and comprises teeth disposed evenly on the periphery thereof. Mis-positioning of the weld nut is avoided when soldering the weld nut to a printed circuit board.

5 Claims, 5 Drawing Sheets

WELD ASSEMBLY

BACKGROUND

1. Technical Field

The present disclosure relates to a weld assembly.

2. Description of Related Art

Weld nuts are used in electronic devices to connect components. The weld nut is soldered on a first component, such as a printed circuit board. A screw passes through a hole defined in a second component, and is screwed into the nut, thus connecting the two components.

Soldering is used to connect the nut to the first component. However, the solder used may be disposed unevenly, causing the nut to be mis-positioned and thus unsuitable.

What is needed is a weld nut which can be soldered accurately in position on a component.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
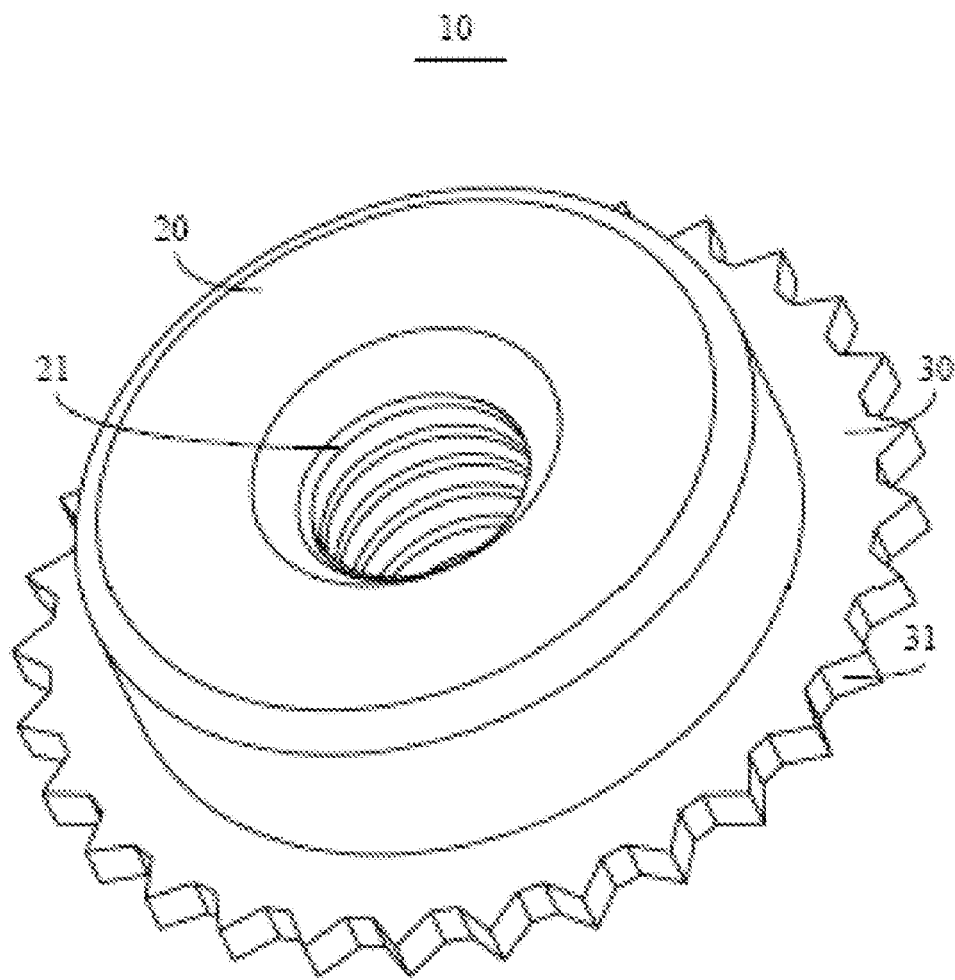
FIG. 1 is a schematic, isometric view of a weld nut according to an exemplary embodiment.
Figure 2A:
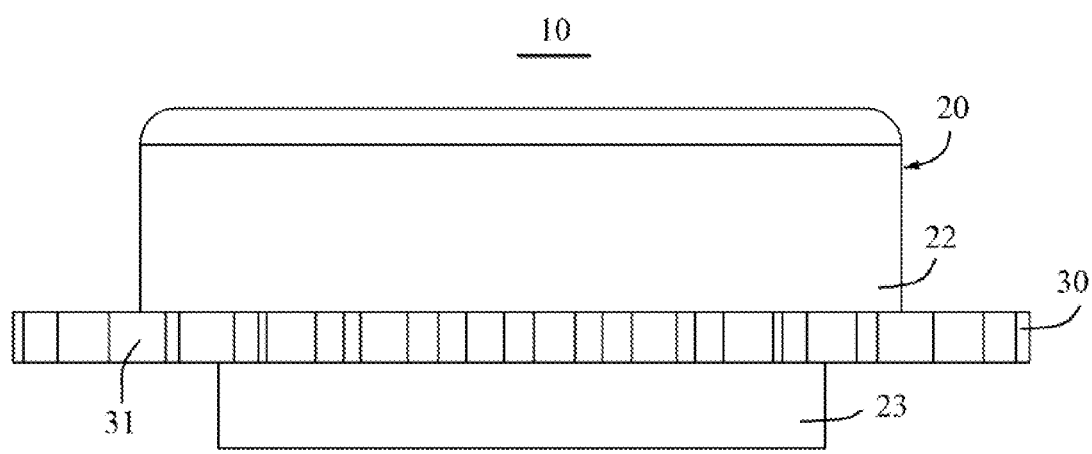
FIG. 2 is a schematic, front view of the weld nut of FIG. 1.
Figure 2B:
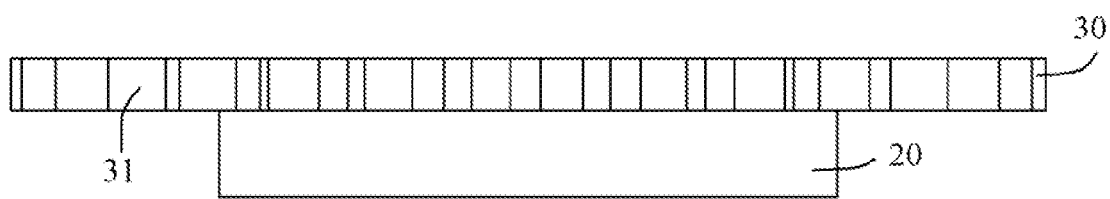

Referring to FIGS. 2A and 2B, a weld nut 10 of the weld assembly of the present disclosure according to an exemplary embodiment is disclosed. The weld nut 10 includes a main body 20 and a flange 30 extended outwardly from the main body 20 and surrounding the main body 20. In the first embodiment, as shown in FIG. 2A, the flange 30 is extended from a middle portion of the main body 20, thus dividing the main body 20 into a connection portion 22 and a plug portion 23. In the second embodiments, as shown in FIG. 2B the flange 30 may be extended from either end of the main body 20.

The main body 20 defines an axial threaded hole 21 therein. [0012] The flange 30 is gear shaped and teeth 31 of the flange are disposed evenly on the periphery of the flange 30.

Figure 3:
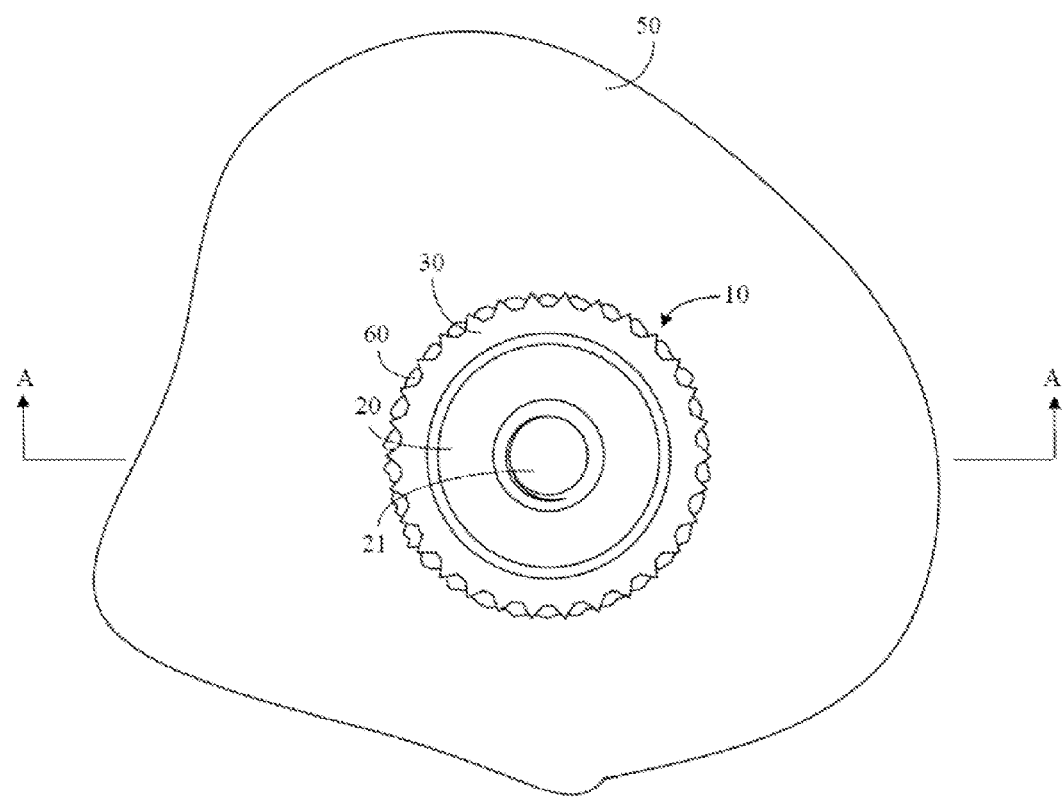
FIG. 3 is a schematic, top view showing the weld nut of FIG. 1 soldered on a printed circuit board.
Figure 4:
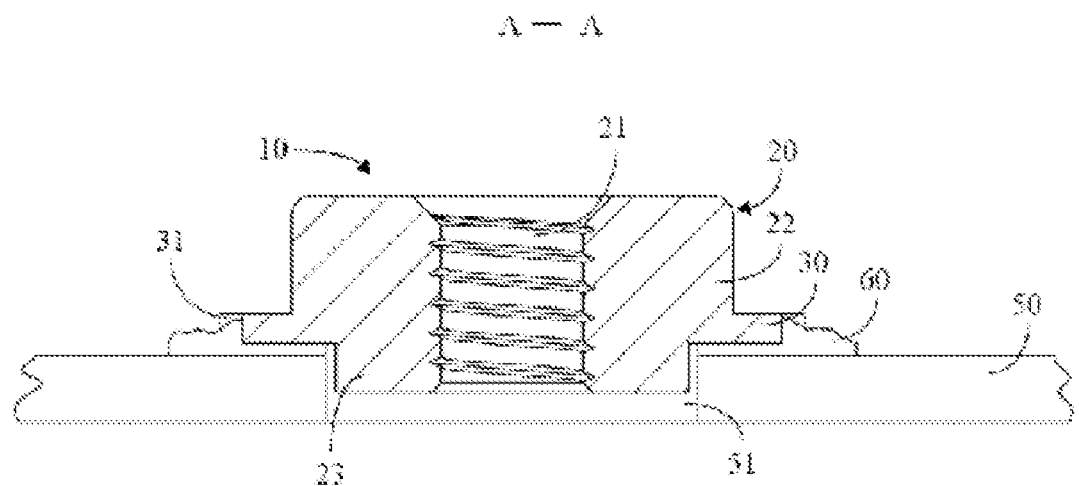
FIG. 4 is a section view along A-A line of FIG. 3.

Referring to FIGS. 3 and 4, the weld assembly of the present disclosure is disclosed. printed circuit board (PCB) 50 defines a mounting hole 51. The mounting hole 51 is bigger than the plug portion 23 of the weld nut 10, and is smaller than the flange 30 in diameter. The mounting hole 51 is equal to or bigger than the plug portion 23 in height.

In assembly, firstly solder 60 is applied on the PCB 50 around the mounting hole 51. The plug portion 23 of the weld nut 10 is inserted into the mounting hole 51 till the flange 30 contacts the solder 60. The solder 60 is soldered and melted. Portion of the solder 60 is disposed evenly below the flange 30, and connects the weld nut 10 to the PCB 50. The remaining solder 60 flows into gaps between the teeth 31 of the flange 30, and adheres to the teeth 31. Because the remaining solder 60 flows into the gaps and does not collect under the flange 30, mis-positioning of the weld nut 10 is avoided. And, as the solder 60 in the gaps adheres to the evenly disposed teeth 31, the weld nut 10 is soldered to the PCB 50 firmly and evenly.

Moreover, it is to be understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. A weld assembly comprising:
a printed circuit board (PCB) defining a mounting hole;
a weld nut connected to the PCB, the weld nut comprising:
a main body: and
a flange extending outwardly from the weld nut and surrounding the weld nut, the flange having a larger size than the mounting hole,
a plurality of teeth disposed evenly on a periphery of the flange: and
a plurality of gaps formed between the teeth: and
a solder having a first portion disposed evenly below the flange so as to connect the weld nut to the PCB and a second portion flowing into the gaps and adhering to the teeth.

2. The weld assembly of claim 1, wherein the flange extends outwardly from a middle portion of the main body.

3. The weld assembly of claim 1, wherein the flange extends outwardly from an end of the main body.

4. The weld assembly of claim 1, wherein the main body defines an axial threaded hole therein.

5. The weld assembly of claim 1, wherein the flange is gearshaped.

* * * * *